(12) United States Patent
Zhao et al.

(10) Patent No.: US 9,258,909 B2
(45) Date of Patent: Feb. 9, 2016

(54) BOX USED FOR PACKAGING DISPLAY PANEL COMPONENTS

(71) Applicant: SHENZHEN CHINA STAR OPTOELECTRONICS TECHNOLOGY CO., LTD, Shenzhen (CN)

(72) Inventors: Zhilin Zhao, Shenzhen (CN); Yicheng Kuo, Shenzhen (CN); Yuchun Hsiao, Shenzhen (CN); Shih hsiang Chen, Shenzhen (CN); Jiahe Cheng, Shenzhen (CN); Jiaxin Li, Shenzhen (CN)

( * ) Notice: Subject to any disclaimer, the term of this patent is extended or adjusted under 35 U.S.C. 154(b) by 376 days.

(21) Appl. No.: 13/980,613

(22) PCT Filed: Jun. 20, 2013

(86) PCT No.: PCT/CN2013/077554
§ 371 (c)(1),
(2) Date: Jul. 19, 2013

(87) PCT Pub. No.: WO2014/190570
PCT Pub. Date: Dec. 4, 2014

(65) Prior Publication Data
US 2015/0223350 A1    Aug. 6, 2015

(30) Foreign Application Priority Data

May 31, 2013    (CN) .......................... 2013 1 0213051

(51) Int. Cl.
*H05K 5/00* (2006.01)
*B65D 85/48* (2006.01)
*B65D 81/133* (2006.01)

(52) U.S. Cl.
CPC ............ *H05K 5/0017* (2013.01); *B65D 81/133* (2013.01); *B65D 85/48* (2013.01); *H05K 5/0047* (2013.01)

(58) Field of Classification Search
None
See application file for complete search history.

(56) References Cited

U.S. PATENT DOCUMENTS

| 3,635,331 | A | * | 1/1972 | Zucker | B65D 73/0057 206/469 |
|---|---|---|---|---|---|
| 5,126,725 | A | * | 6/1992 | Yanagisawa | G06F 1/1616 341/22 |
| 8,294,844 | B2 | * | 10/2012 | Chen | G02F 1/133308 349/58 |
| 8,358,387 | B2 | * | 1/2013 | Choi | G02B 6/009 349/150 |
| 8,432,525 | B2 | * | 4/2013 | Choi | G02B 6/0088 349/158 |
| 8,497,936 | B2 | * | 7/2013 | Park | G06F 1/1686 348/333.01 |
| 8,506,106 | B2 | * | 8/2013 | Kim | G02B 6/0031 362/610 |

(Continued)

FOREIGN PATENT DOCUMENTS

| CN | 101554944 A | 10/2009 |
|---|---|---|
| CN | 101575023 A | 11/2009 |

(Continued)

OTHER PUBLICATIONS

Huang Rong, the International Searching Authority written comments, Jan. 2014, CN.

*Primary Examiner* — Courtney Smith
*Assistant Examiner* — Rashen E Morrison (57) ABSTRACT

A box used for packaging a display panel component includes a first receiving cavity receiving a panel cell of the display panel component and a second receiving cavity receiving a printed circuit board (PCB) of the display panel component. The second receiving cavity is arranged at one side of the first receiving cavity. A bottom of the second receiving cavity is lower in height than a bottom of the first receiving cavity.

8 Claims, 9 Drawing Sheets

(56) References Cited

U.S. PATENT DOCUMENTS

| | | | | |
|---|---|---|---|---|
| 8,720,691 B2* | 5/2014 | Hu | | B65D 5/5085 206/454 |
| 8,727,119 B2* | 5/2014 | Hsiao | | B65D 21/0219 206/454 |
| 8,864,357 B2* | 10/2014 | Kim | | G02B 6/0021 362/296.05 |
| 9,045,273 B2* | 6/2015 | Guo | | B65D 81/056 |
| 2003/0223020 A1* | 12/2003 | Lee | | G02B 6/0088 349/58 |
| 2004/0264211 A1* | 12/2004 | Han | | G02B 6/0088 362/561 |
| 2005/0078469 A1* | 4/2005 | Jeong | | G02B 6/0088 362/633 |
| 2005/0183305 A1* | 8/2005 | Hirata | | G09F 13/04 40/615 |
| 2007/0035689 A1* | 2/2007 | Ryu | | G02F 1/13452 349/149 |
| 2007/0046617 A1* | 3/2007 | Song | | G02F 1/133608 345/102 |
| 2007/0139578 A1* | 6/2007 | Zhou | | G06F 1/1605 349/58 |
| 2008/0030645 A1* | 2/2008 | Nam | | G02F 1/133608 349/61 |
| 2009/0059539 A1* | 3/2009 | Ryu | | H04N 5/44 361/736 |
| 2009/0310058 A1* | 12/2009 | Kim | | G02F 1/133604 349/58 |
| 2010/0259881 A1* | 10/2010 | Choi | | G06F 1/1601 361/679.21 |
| 2011/0116001 A1* | 5/2011 | Chen et al. | | 349/58 |
| 2012/0019989 A1* | 1/2012 | Qiu | | H05K 9/0054 361/679.01 |
| 2012/0236588 A1* | 9/2012 | Shin | | G02B 6/0018 362/602 |
| 2013/0039036 A1* | 2/2013 | Son | | G02F 1/1336 362/97.1 |
| 2013/0215359 A1* | 8/2013 | Chun | | G02F 1/1333 349/58 |
| 2014/0022822 A1* | 1/2014 | Lee | | G09F 13/22 362/613 |
| 2014/0262927 A1* | 9/2014 | Guo | | B65D 81/056 206/706 |
| 2014/0332422 A1* | 11/2014 | Hu | | B65D 81/05 206/320 |
| 2014/0340610 A1* | 11/2014 | Hu | | G02F 1/133308 349/58 |
| 2014/0347864 A1* | 11/2014 | Kawada | | F21K 9/50 362/294 |
| 2014/0362325 A1* | 12/2014 | Lee | | G02F 1/133308 349/58 |
| 2015/0023001 A1* | 1/2015 | Lee | | G02F 1/133602 362/97.1 |
| 2015/0219839 A1* | 8/2015 | Jung | | G02B 6/0088 362/606 |

FOREIGN PATENT DOCUMENTS

| | | |
|---|---|---|
| CN | TW201118012 A1 | 6/2011 |
| CN | 202110373 U | 1/2012 |
| CN | 102616469 A | 8/2012 |
| CN | 102897436 A | 1/2013 |
| CN | 102910378 A | 2/2013 |
| CN | 102991884 A | 3/2013 |
| CN | 203173159 U | 9/2013 |
| JP | 2002332023 A | 11/2002 |
| JP | 2003276790 A | 10/2003 |
| KR | 10-2011-0070547 A | 6/2011 |
| KR | 20-2011-0008397 U | 8/2011 |

\* cited by examiner

FIG. 1

PRIOR ART

FIG. 2

PRIOR ART

FIG. 3

PRIOR ART

FIG. 4

PRIOR ART

FIG. 5

PRIOR ART

BOX USED FOR PACKAGING DISPLAY PANEL COMPONENTS

TECHNICAL FILED

The present disclosure relates to the field of a liquid crystal display (LCD), and more particularly to a box used for packaging a display panel component.

BACKGROUND

At present, many methods for packaging a liquid crystal (LC) panel are used in a panel field. A most common use that a box used for packaging an LC glass is manufactured by foaming molding buffer material. A stereoplasm box manufactured by injection molding or blow molding can also be used.

Figure 1:
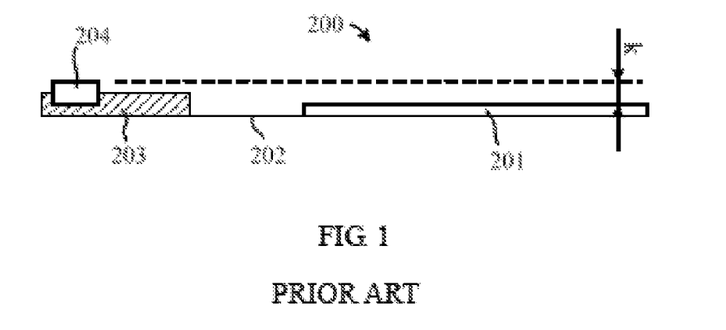
FIG. 1 is a structural diagram of a display panel component.
Figure 3:
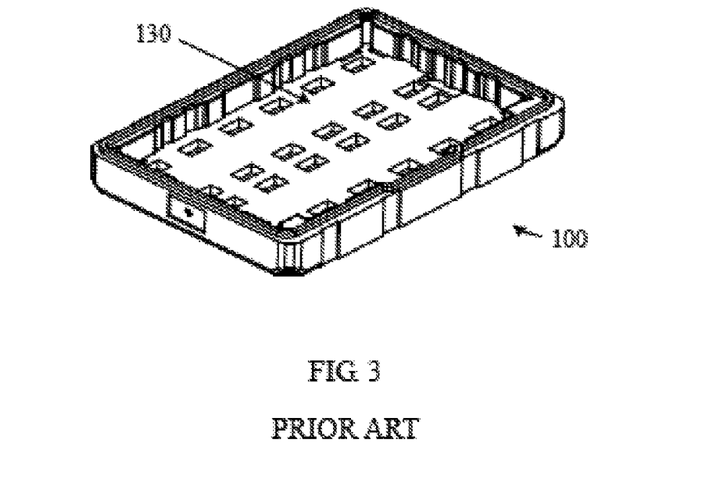
FIG. 3 is a structural diagram of a first box of the prior art.
Figure 4:
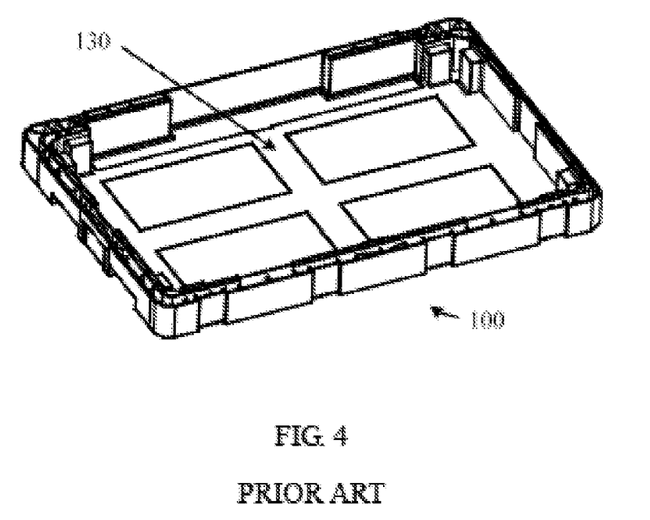
FIG. 4 is a structural diagram of a second box of the prior art.
Figure 5:
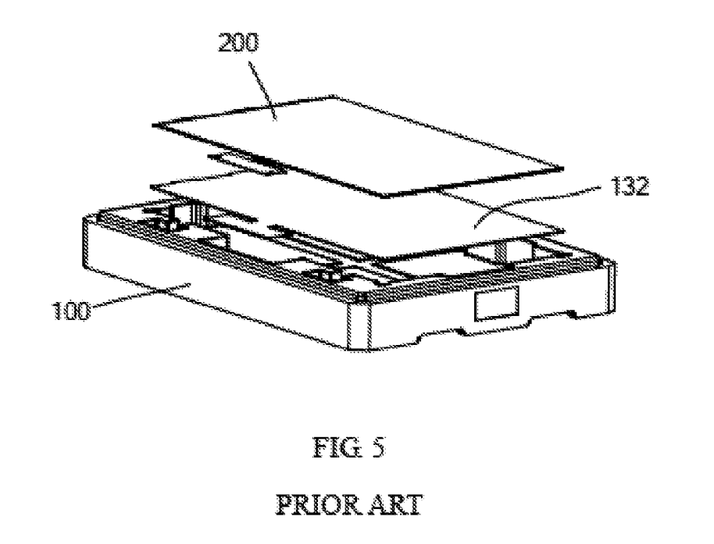
FIG. 5 is a schematic diagram of display panel components packaged in a box of the prior art.

An open cell (OC) display panel component is a display panel component which has been assembled, and where a circuit board is arranged on the display panel component. Because the display panel component includes a printed circuit board (PCB), height of an entire display panel component 200 is not uniform, which makes for a decreased internal volume of the stereoplasm box for components. As shown in FIG. 1, the display panel component 200 includes a panel cell 201, a chip on film (COF) 202, a printed circuit board (PCB) 203, and a connector 204 arranged on the PCB 203. In addition, other electronic components are also arranged on the PCB 203, namely a plurality of electronic components are soldered on the PCB 203. The connector 204 has the greatest height of all electronic components arranged on the PCB 203, thus, a sum of the height of the connector 204 and height of the PCB 203 is the greatest out of all of the display panel components. A difference value between total height of the connector and the PCB and height of the panel cell 201 is K. FIG. 3 and FIG. 4 are structural diagrams of a box 100 used for packaging the display panel component 200, where the box 100 is configured with a receiving cavity 130. As shown in FIG. 5, the display panel component 200 is disposed in the box 100, and a buffer gasket 132 is arranged between two adjacent display panel components. When N display panel components 200 are disposed in the box 100, a height difference T is formed between the height of the panel cells 201 and the total height of the connectors and the PCBs, namely T=n*k.

Figure 2:
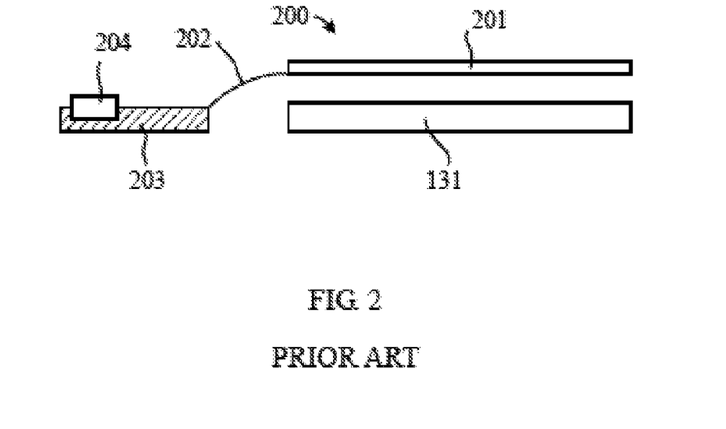
FIG. 2 is a schematic diagram of display panel components packaged in a box by adding a sheet material into the box of the prior art.

Because of the height difference T, the display panel components are prone to damage (namely the panel cells are prone to damage because of an extrusion caused by the display panel components arranged unevenly). As shown in FIG. 2, atypical method for avoiding damage is to add sheet material 131 to offset the height difference T, where height of the sheet material 131 is T. The typical method allows the panel cells of the display panel components to be evenly disposed, thereby ensuring security of the display panel components.

However, at present, the typical box 100 has a small internal volume for components, which results in large costs of transportation and storage. Thus, it is necessary to improve packaging of the display panel components.

SUMMARY

In view of the above-described problems, the aim of the present disclosure is to provide a box used for packaging a plurality of display panel components.

The aim of the present disclosure is achieved by the following method.

A box used for packaging a display panel component comprises a first receiving cavity receiving a panel cell of the display panel component and a second receiving cavity receiving a printed circuit board (PCB) of the display panel component. The second receiving cavity is arranged at one side of the first receiving cavity. A bottom of the second receiving cavity is lower in height than a bottom of the first receiving cavity.

In one example, the bottom of the second receiving cavity and the bottom of the first receiving cavity are parallel to each other. When an internal volume for components of the box is small, a structure of the box of the present disclosure is used, which allows the PCBs of the display panel components 200 to be disposed evenly, thereby avoiding overlarge height of the PCBs laid in the box.

In one example, the bottom of the second receiving cavity is tilted towards the bottom of the first receiving cavity, a connector arranged on the PCB of the display panel component is disposed at a first side of the second receiving cavity. When the internal volume for components of the box is large, a height difference T between total height of the PCBs of the display panel components and total height of the panel cells of the display panel components in the box is large. The depth of the second receiving cavity is too large, which leads the chip on film (COF) to fall off. Thus, the bottom of the second receiving cavity is tilted, the PCB of the display panel component is laid on the first side, where the connector is arranged on the PCB, the COF of the display panel component is laid on the second side (the tilted bottom of the second receiving cavity causes the depth of the first side of the second receiving cavity is greater than the depth of the second side of the second receiving cavity), the PCBs are not loose, thus, the COF of the PCB are not prone to fall off, thereby effectively ensuring security of open cell (OC).

In one example, a second side of the bottom of the second receiving cavity is connected with one side of the bottom of the first receiving cavity, which effectively protects the COF.

In one example, the first receiving cavity is arranged is a main sub-box of the box, and the second receiving cavity is arranged in an external accessory sub-box of the box, a notch is arranged at one side of the main sub-box. The accessory sub-box is sleeved in the notch In one example, the notch is a rectangular structure. The accessory sub-box comprises a recess portion forming the second receiving cavity and a limit external eave. A shape of the recess portion corresponds to a shape of the notch. Length and width of the limit external eave is greater than length and width of the notch. The accessory sub-box is fixed in the notch through limit of the limit external eave. The accessory sub-box is directly fixed in the notch through limit of the limit external eave, which is easy operation and stable.

In one example, two sides of the recess portion are configured with a limit surface. The accessory sub-box may not move and tilt when the accessory sub-box is sleeved in the notch through the limit surfaces.

In one example, the bottom of the second receiving cavity and the bottom of the first receiving cavity are parallel to each other. A height difference between total height of the PCBs of the display panel components and total height of the panel cells of the display panel components in the box is the height difference T. The depth of the second receiving cavity is greater than or equal to the height difference T, which avoids the PCBs and electronic components arranged on the PCBs from protruding above a top horizontal plane of the box (namely a horizontal plane of a topside display panel component), thereby improving the internal volume of the box and ensuring security of the display panel components.

In one example, the bottom of the second receiving cavity is tilted towards the bottom of the first receiving cavity, a connector arranged on the PCB of the display panel component is laid on a first side of the second receiving cavity. A height difference between total height of the PCBs of the display panel components and total height of the panel cells of the display panel components in the box is T. The depth of the second receiving cavity receiving the PCB of the display panel component is greater than or equal to the height difference T, which avoids the PCBs and electronic components arranged on the PCBs from protruding above a top horizontal plane of the box (namely a horizontal plane of a topside display panel component), thereby improving the internal volume of the box and ensuring security of the display panel components.

In one example, a bottom of the box is configured with a stiffener, which improves structure strength of the box. Thus, distortion structural distortion of the box, which results in damage of the panel cells, does not happen when the box includes a plurality of display panel components.

The box of the present disclosure used for packaging display panel components comprises the first receiving cavity receiving the panel cell of the display panel component and the second receiving cavity receiving the printed circuit board (PCB) of the display panel component. The second receiving cavity is arranged at one side of the first receiving cavity. The bottom of the second receiving cavity is lower in height than the bottom of the first receiving cavity, which allows the PCB laid is the second receiving cavity is lower in height than the panel cell laid in the first receiving cavity, thus, a height difference T caused by a connector arranged on the PCB may be completely offset or partly offset (When N display panel components are disposed in the box, the height difference T is formed between the height of the panel cells and the height of connectors arranged on the PCB, namely T=n*k). Furthermore, sheet materials used to add to the height may be canceled or a thickness of the sheet materials can be reduced. Because a total height of the PCBs and the panel cells is reduced, the internal volume for components of the box is improved when the height of the box is not changed.

DETAILED DESCRIPTION

The present disclosure will further be described in detail in accordance with the figures and the exemplary examples.

As shown in FIG. 6 to FIG. 16, a box 100 used for packaging a display panel component of the present disclosure comprises a first receiving cavity 110 receiving a panel cell 201 of the display panel component 200, and a second receiving cavity 120 receiving a printed circuit board (PCB) 203 of the display panel component 200, where the second receiving cavity 120 is arranged at one side of the first receiving cavity 110. A bottom of the second receiving cavity 120 is lower in height than a bottom of the first receiving cavity 110, which allow the PCB 203 laid in the second receiving cavity 120 to be lower in height than the panel cell 201 laid in the first receiving cavity, thus, a height difference T caused by a connector arranged on the PCB 203 may be completely offset or partly offset (When N display panel components 200 are disposed in the box 100, the height difference T is formed between the height of the panel cells 201 and height of connectors arranged on the PCB, namely T=n*k). Furthermore, sheet materials used to add to the height may be canceled or a thickness of the sheet materials can be reduced. Because a total height of the PCBs 203 and the panel cells 201 is reduced, an internal volume for components of the box 100 is improved when the height of the box 100 is not changed.

Example 1

Figure 6:
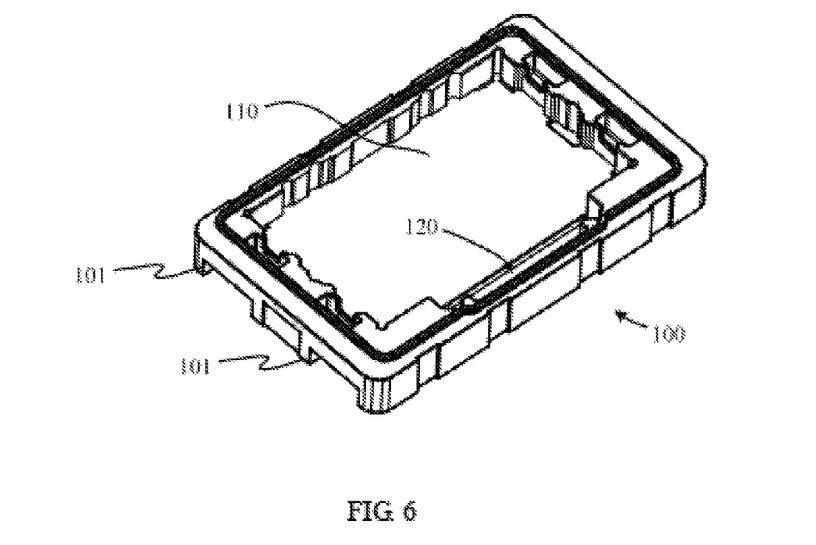
FIG. 6 is a first structural diagram of a box of a first example of the present disclosure.
Figure 7:
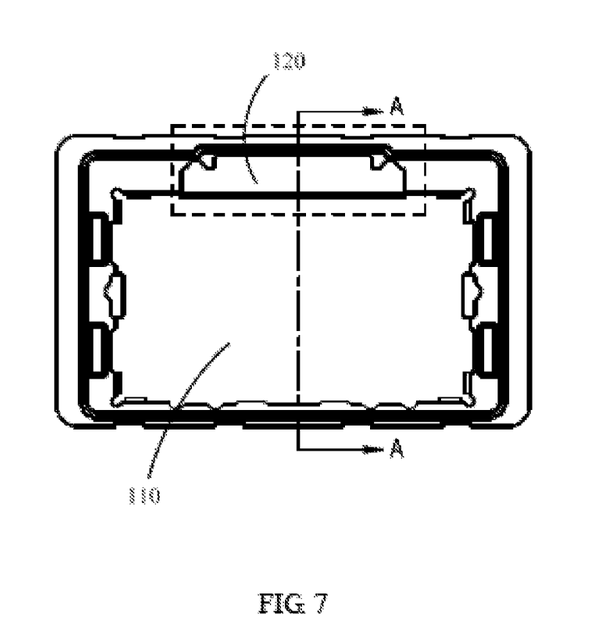
FIG. 7 is a second structural diagram of a box of a first example of the present disclosure.
Figure 8:
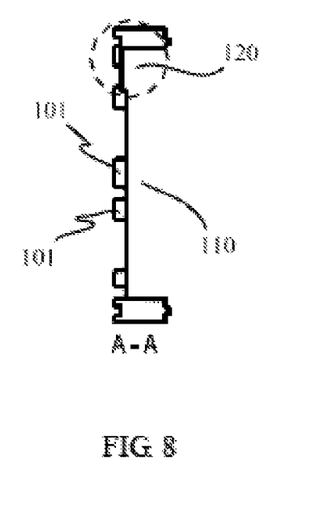
FIG. 8 is a sectional view of FIG. 7 taken from line A-A.

As shown in the FIG. 6 to FIG. 8, a box 100 of a first example of the present disclosure comprises a first receiving cavity 110 receiving a panel cell 201 of a display panel component 200 and a second receiving cavity 120 receiving a printed circuit board (PCB) 203 of the display panel component 200, where the second receiving cavity 120 is arranged at one side of the first receiving cavity 110. A bottom of the second receiving cavity 120 is lower in height than a bottom of the first receiving cavity 110, and the bottom of the second receiving cavity 120 and the bottom of the first receiving cavity 110 are parallel to each other. The first example applies to the box 100 having a small internal volume for components. Compared to FIG. 1, the box 100 of the first example allows the PCB 203 of the display panel component 200 to be disposed evenly, thereby avoiding an overlarge height of the PCBs 203 laid in the box 100.

The lower bottom of the second receiving cavity 120 of the first example may be formed by directly modifying a typical box. Because a bottom of the typical box is thick and volume of the second receiving cavity 120 is small, which does not obviously affect structural strength of the box.

In the first example, the height difference between total height of the PCBs 203 of the display panel components and total height of the panel cells 201 of the display panel components in the box 100 is T, and height of the second receiving cavity is more than or equal to the height difference T, which avoids the PCBs 203 and electronic components arranged on the PCBs 203 from protruding above a top horizontal plane of the box 100 (namely a horizontal plane of a topside display panel component), thereby improving the internal volume of the box 100 and ensuring security of the display panel components 200.

As shown in the FIG. 6 and FIG. 8, in the first example, a bottom of the box 100 is configured with a stiffener 101, which improves structure strength of the box 100. Thus, over-large structural distortion of the box, which results in damage of the panel cells, does not happen when the box 100 includes a plurality of display panel components 200.

Example 2

Figure 9:
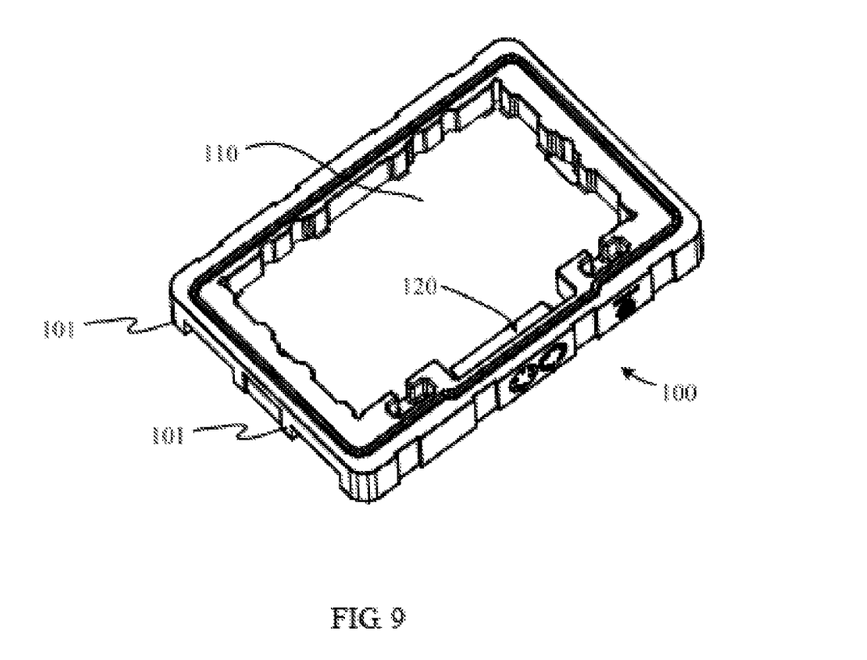
FIG. 9 is a first structural diagram of a box of a second example of the present disclosure.
Figure 10:
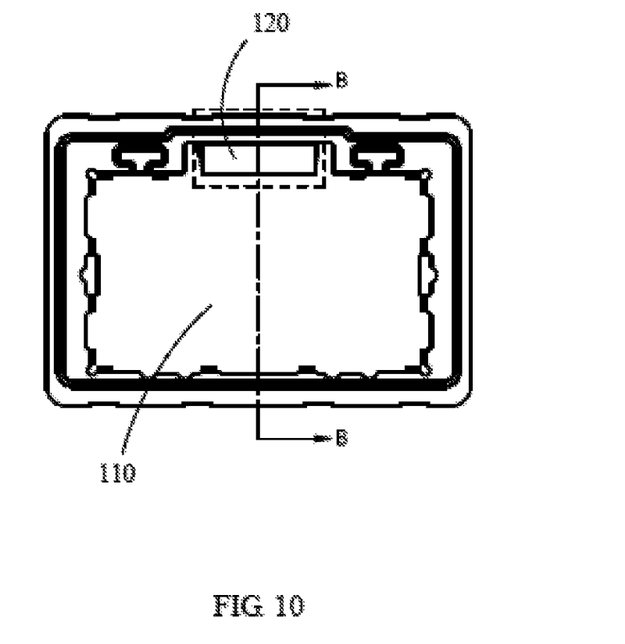
FIG. 10 is a second structural diagram of a box of a second example of the present disclosure.
Figure 11:
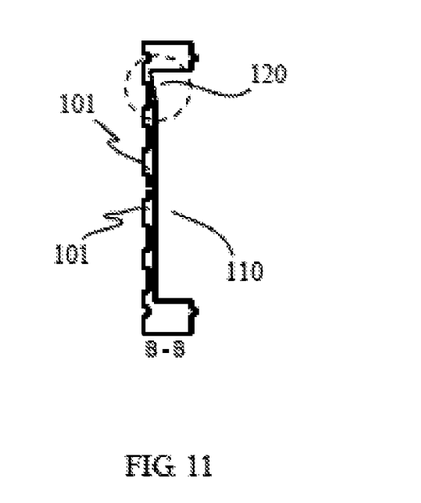
FIG. 11 is a sectional view of FIG. 10 taken from line B-B.
Figure 12:
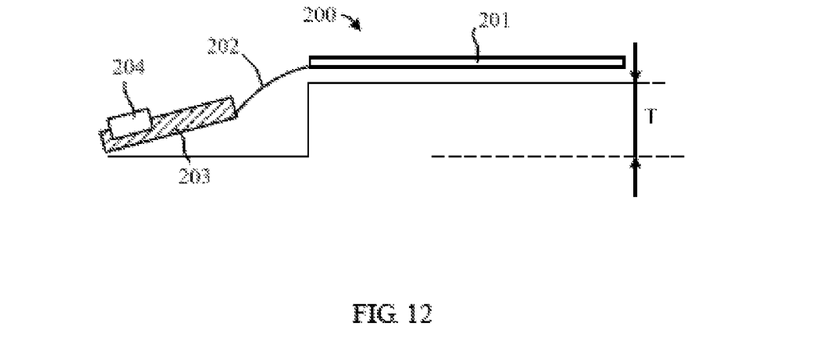
FIG. 12 is a structural diagram of display panel components at a large height difference T state using a parallel-sink method to package.
Figure 13:
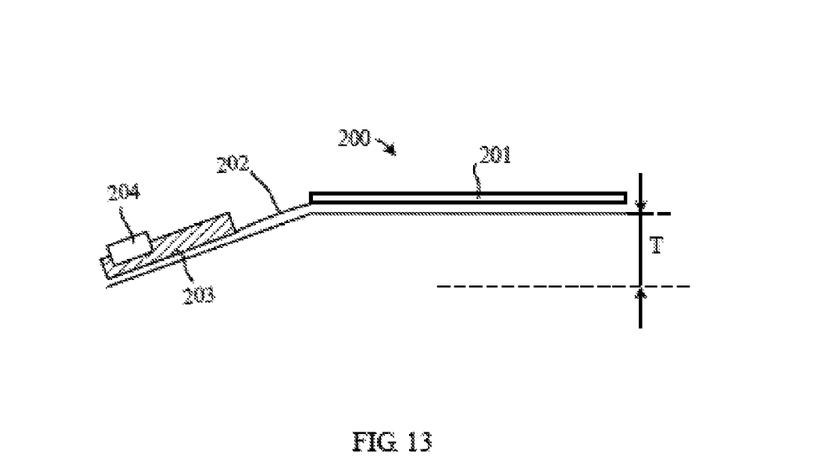
FIG. 13 is a structural diagram of display panel components at a large height difference T state using a tilted-sink method to package.
Figure 14:
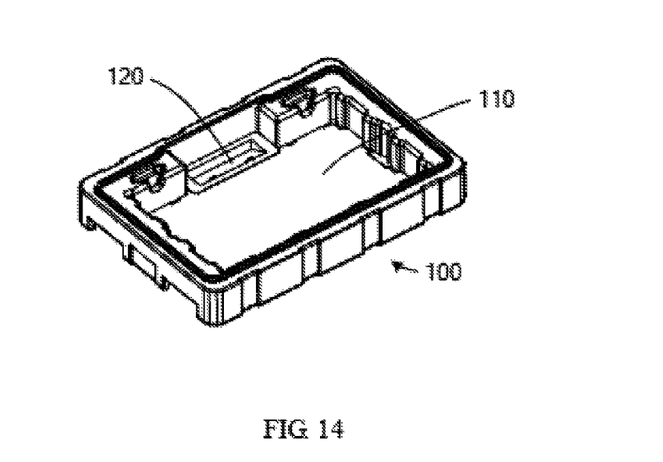
FIG. 14 is a first structural diagram of a box of a third example of the present disclosure.
Figure 15:
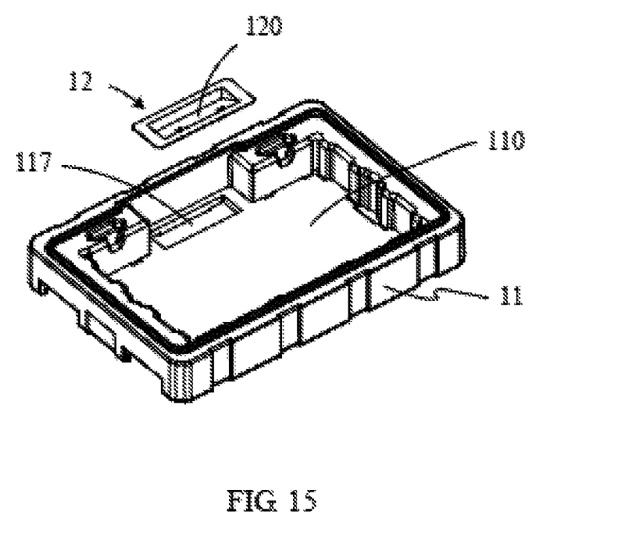
FIG. 15 is a second structural diagram of a box of a third example of the present disclosure.
Figure 16:
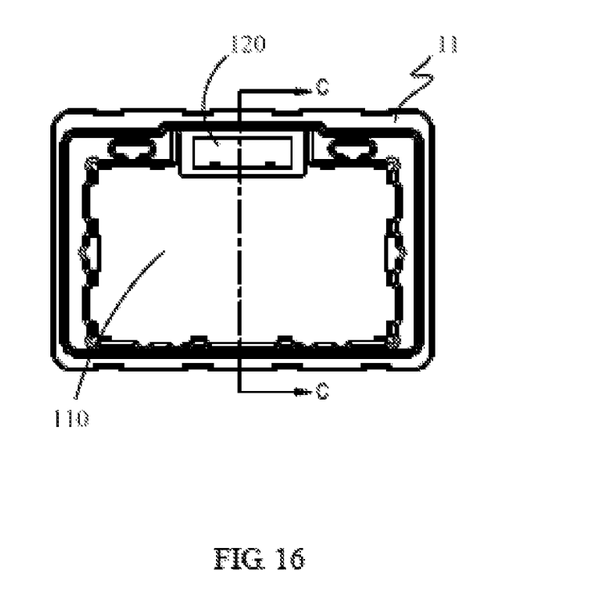
FIG. 16 is a also a structural diagram of the box of the third example of the present disclosure.
Figure 17:
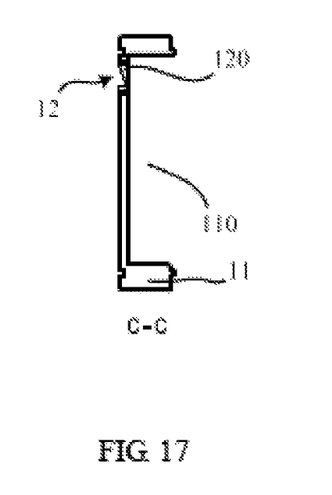
FIG. 17 is a sectional view of FIG. 16 taken from line C-C.
Figure 18:
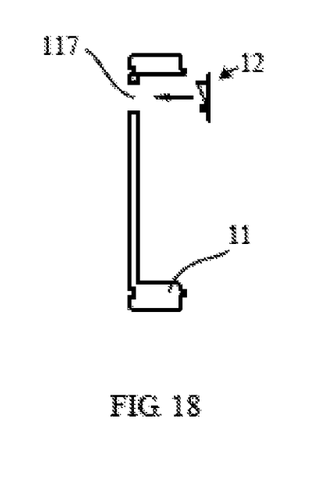
FIG. 18 is a structural diagram of a accessory sub-box installed to a main sub-box of a third example of the present disclosure.

A second example is shown in FIG. 9 to FIG. 11, where a difference between the first example and the second example is that: the bottom of the second receiving cavity 120 is tilted towards the bottom of the first receiving cavity 110 in the second example, thus, depth of a first side of the second receiving cavity 120 is greater than depth of a second side of the second receiving cavity 120. The PCBs 203 of the display panel components is laid on the first side of the second receiving cavity 120 (namely the connector 204 is laid on the first side of the second receiving cavity 120). The second example applies to the box 100 having a large internal volume (namely height of the box is large). The height difference T formed in the box 100 having the large internal volume is greater than the height difference T formed in the box 100 having a small internal volume. As shown in FIG. 12, if the depth of the second receiving cavity 120 is too large, the PCBs may be loose inside. Thus, a chip on film (COF) 202 of the PCBs may easily fall off after the box includes a plurality of display panel components. As shown in FIG. 13, the bottom of the second receiving cavity is tilted, which may allow the PCBs 203 of the display panel components 200 to lie flat in the second receiving cavity 120. Because the PCB of the display panel component is laid on the first side, where the connector is arranged on the PCB, the COF of the display panel component is laid on the second side (the tilted bottom of the second receiving cavity causes the depth of the first side of the second receiving cavity is greater than the depth of the second side of the second receiving cavity), the PCBs are not loose, thus, the COS 202 of the PCB are not prone to fall off, thereby effectively ensuring security of the display panel component.

In the second example, the height difference between total height of the PCBs 203 of the display panel components 200 and total height of the panel cells 201 of the display panel components 200 in the box 100 is T. Depth of the first side of the second receiving cavity receiving the PCBs 203 of the display panel components 200 is greater than or equal to the height difference T, which avoids the PCBs and the electronic components arranged on the PCBs from protruding above top horizontal plane of the box 100 (namely a horizontal plane of a topside display panel component), thereby improving the internal volume of the box 100 and ensuring security of the box 100.

As shown in FIG. 11, in the second example, the second side of the bottom of the second receiving cavity is connected with the bottom of the first receiving cavity, namely the first receiving cavity directly connects with the second receiving cavity. Thus, the COF 202 may lie flat on the bottom of the second receiving cavity and be effectively protected.

Example 3

A third example is shown in FIG. 14 to FIG. 18, where a difference between the second example and the third example is that: the first receiving cavity 110 of the box 100 is arranged in a main sub-box 11 of the box 100, and the second receiving cavity 120 is arranged in an external accessory sub-box 12, a notch 117 is arranged at one side of the main sub-box 11. The accessory sub-box 12 is sleeved in the notch 117.

Figure 19:
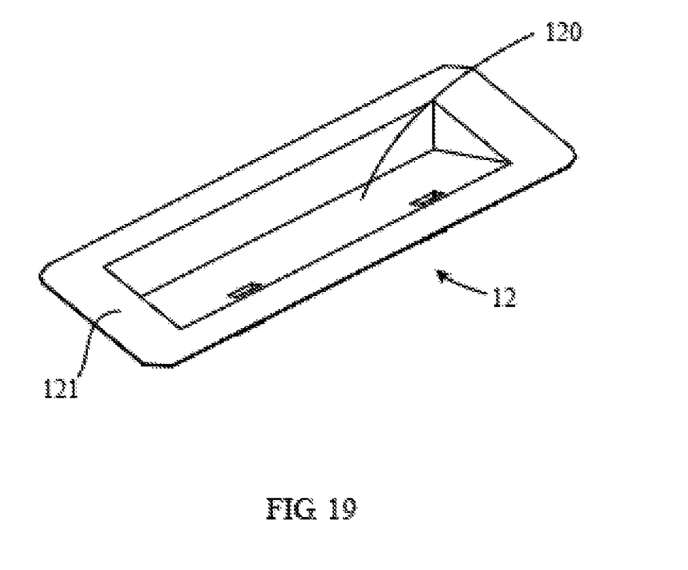
FIG. 19 is a first structural diagram of a accessory sub-box of a third example of the present disclosure.
Figure 20:
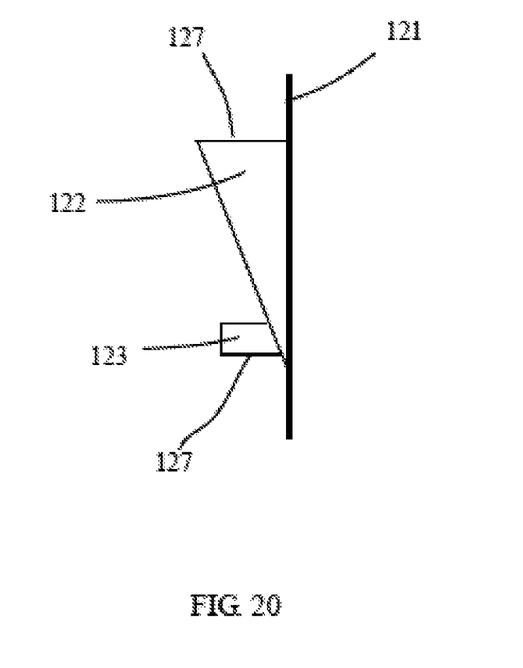
FIG. 20 is a second structural diagram of an accessory sub-box of a third example of the present disclosure.

The notch 117 is a rectangular structure. As shown in FIG. 19 and FIG. 20 the accessory sub-box comprises a recess portion 122 forming the second receiving cavity 120 and a limit external eave 121. A shape of the recess portion corresponds to a shape of the notch 117. Length and width of the limit external eave 121 is greater than length and width of the notch 117. The accessory sub-box 12 is fixed in the notch 117 through limit of the limit external eave 121. The accessory sub-box 12 is directly fixed in the notch 117 through limit of the limit external eave 121, which is easy operation and stable.

A bottom of the second receiving cavity 120 of the third example is tilted, as shown in FIG. 20, where one side of the recess portion 122 is configured with a tilted surface, which results in a move of the accessory sub-box 12 when the accessory sub-box 12 is sleeved in the notch 117, thus, the one side of the recess portion 122 is configured with a barricade 123. Two limit surfaces 127 are formed by the barricade 123 and the recess portion 122, where the two limit surfaces are arranged in two side of the recess portion 122. Thus, the accessory sub-box 12 may not move and tilt when the accessory sub-box 12 is sleeved in the notch 117 through the limit surfaces.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

We claim:

1. A box used for packaging a display panel component, comprising:
   a first receiving cavity receiving a panel cell of tire display panel component; and a second receiving cavity receiving a printed circuit board (PCB) of the display panel component; wherein the second receiving cavity is arranged at one side of the first receiving cavity; a bottom of the second receiving cavity is lower in height than a bottom of the first receiving cavity, wherein the whole bottom of the second receiving cavity is totally tilted towards the bottom of the first receiving cavity, and a connector arranged on the PCB of the display panel component is disposed at a first side of the second receiving cavity, wherein an eave portion extending laterally from a top of the second receiving cavity is connected and coplanar with one side of the bottom of the first receiving cavity.

2. The box used for packaging the display panel component of claim 1, wherein the bottom of the second receiving cavity and the bottom of the first receiving cavity are parallel to each other.

3. The box used for packaging the display panel component of claim 1, wherein the first receiving cavity is arranged in a main sub-box of the box, and the second receiving cavity is arranged in an external accessory sub-box of the box, a notch is arranged at one side of the main sub-box; and the accessory sub-box is sleeved in the notch.

4. The box used for packaging the display panel component of claim 3, wherein the notch is a rectangular structure, the accessory sub-box comprises a recess portion forming the second receiving cavity and a limit external cave; a shape of the recess portion corresponds to a shape of the notch, length and width of the limit external cave is greater than length and width of the notch, and the accessory sub-box is fixed in the notch through limit of the limit external cave.

5. The box used for packaging the display panel component of claim 4, wherein two sides of the recess portion are configured with a limit surface.

6. The box used for packaging the display panel component of claim 1, wherein the bottom of the second receiving cavity and the bottom of the first receiving cavity are parallel to each other; a height difference between total height of the PCBs of the display panel components and total height of the panel cells of the display panel components in the box is T; and depth of the second receiving cavity is greater than or equal to the height difference T.

7. The box used for packaging the display panel component of claim 1, wherein the bottom of the second receiving cavity is tilted towards the bottom of the first receiving cavity, a connector arranged on the PCB of the display panel component is laid on a first side of the second receiving cavity; a height difference between total height of the PCBs of the display panel components and total height of the panel cells of the display panel components in the box is T; and depth of the second receiving cavity receiving the PCB of the display panel component is greater than or equal to the height difference T.

8. The box used for packaging the display panel component of claim 1, wherein an outer bottom opposite to the first receiving cavity of the box is configured with a stiffener.

* * * * *